(12) United States Patent
Kim

(10) Patent No.: US 8,362,513 B2
(45) Date of Patent: Jan. 29, 2013

(54) SURFACE MOUNT LED AND HOLDER

(75) Inventor: Chong S Kim, Glenview, IL (US)

(73) Assignee: Illinois Tool Works Inc., Glenview, IL (US)

( * ) Notice: Subject to any disclaimer, the term of this patent is extended or adjusted under 35 U.S.C. 154(b) by 347 days.

(21) Appl. No.: 12/918,504

(22) PCT Filed: Feb. 4, 2009

(86) PCT No.: PCT/US2009/033028
§ 371 (c)(1),
(2), (4) Date: Aug. 20, 2010

(87) PCT Pub. No.: WO2009/105334
PCT Pub. Date: Aug. 27, 2009

(65) Prior Publication Data
US 2011/0147785 A1    Jun. 23, 2011

Related U.S. Application Data

(60) Provisional application No. 61/030,763, filed on Feb. 22, 2008.

(51) Int. Cl.
*H01L 33/00* (2010.01)
(52) U.S. Cl. .................. 257/99; 257/678; 257/E33.057; 257/E33.058
(58) Field of Classification Search .............. 257/99, 257/678–733, E23.001–E23.194, E33.057, 257/E33.058
See application file for complete search history.

(56) References Cited

U.S. PATENT DOCUMENTS

| | | | |
|---|---|---|---|
| 4,507,718 A | 3/1985 | Bury | |
| 5,324,962 A | 6/1994 | Komoto et al. | |
| 6,386,733 B1 | 5/2002 | Ohkohdo et al. | |
| 6,525,668 B1 | 2/2003 | Petrick | |
| 6,703,938 B1 | 3/2004 | Clarke | |
| 6,787,435 B2 | 9/2004 | Gibb et al. | |
| 7,472,565 B1 | 1/2009 | Heldoorn | |
| 2011/0133244 A1* | 6/2011 | Seo et al. | 257/99 |
| 2011/0227123 A1* | 9/2011 | Kim et al. | 257/99 |

FOREIGN PATENT DOCUMENTS
JP        61-202484    *    9/1986

OTHER PUBLICATIONS

ISR for PCT/US2009/033028 mailed Mar. 16, 2009.

* cited by examiner

*Primary Examiner* — Jasmine Clark
(74) *Attorney, Agent, or Firm* — Lowe Hauptman Ham & Berner LLP

(57) ABSTRACT

A surface mount LED for attaching an LED to a substrate using a conventional reflow soldering technique. The surface mount LED according to this invention includes an LED and a holder. The LED includes a plurality of leads. The holder supports the LED and includes a plurality of feet arranged at approximately equal intervals around the perimeter of a base of the holder. Each lead is wrapped around a respective foot. The resulting wrapped lead forms a contact point corresponding with a solder pad layout for attaching the surface mount LED to a substrate.

20 Claims, 8 Drawing Sheets

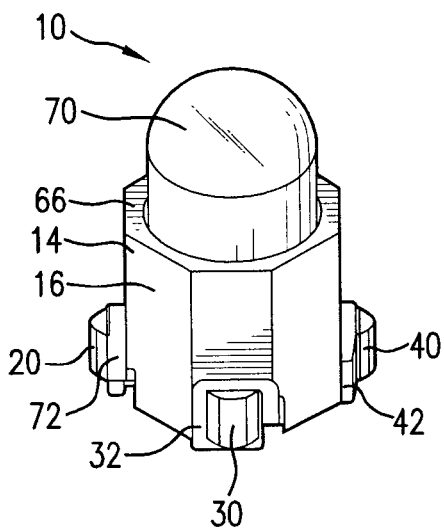
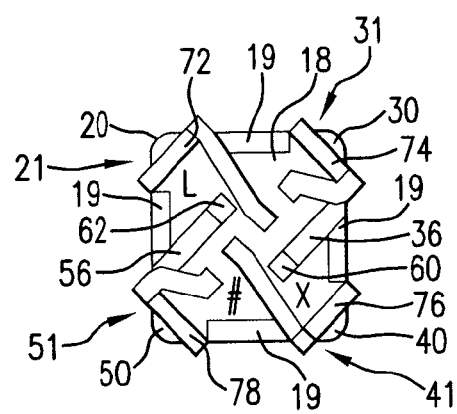
FIG.9         FIG.12
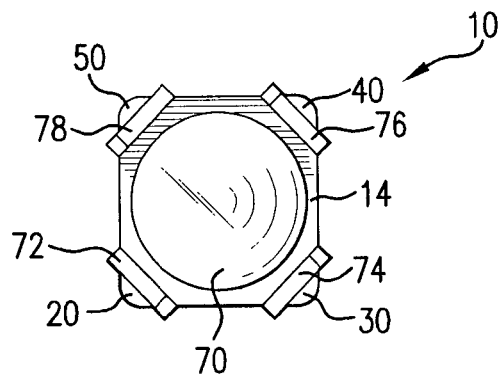
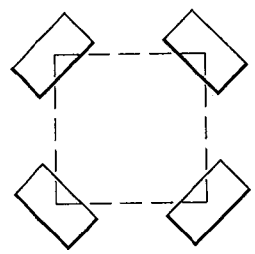
FIG.10        FIG.13
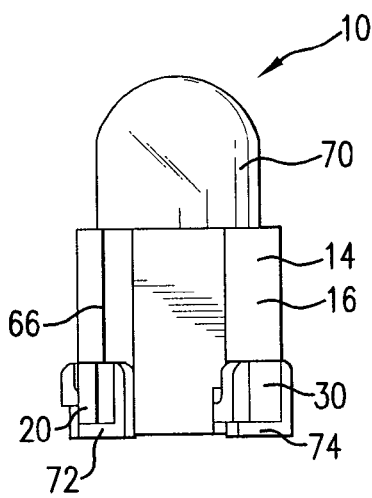
FIG.11

SURFACE MOUNT LED AND HOLDER

CROSS REFERENCE TO RELATED APPLICATIONS

This Application is based on International Application Number PCT/US2009/033028, filed Feb. 4, 2009, and claims priority from US Application No. 61/030,763, filed Feb. 22, 2008, the disclosures of which are hereby incorporated by reference herein in their entirety.

BACKGROUND OF THE INVENTION

1. Field of the Invention

This invention relates to a surface mount light emitting diode (LED) and holder.

2. Description of Prior Art

FIGS. 1a-c and FIGS. 2a-d show various prior art LEDs and holders. The prior art LED as shown in FIGS. 1a-c generally lacks robustness, particularly when exposed to contemporary reflow soldering processes. At a 230 degrees C. soldering profile, such prior art LED and holder maintain a 10 to 20% failure rate. The basic combination of lead frame to epoxy design lacks the necessary thermal protection needed for the unit to survive the reflow process.

FIGS. 2a-d show various views of a prior art through hole LED holder. Through hole LED holders are typically inserted into holes drilled into printed circuit boards (PCB) and mechanically joined to the PCB via a latch. Through hole LED holders need not, but may, be soldered to the PCB. While through hole mounting generally provides strong mechanical bonds, the drilling step results in additional manufacturing expense. Through hole mounting also limits the available routing area for signal traces on layers immediately below the top layer on multilayer boards since the holes must pass through all layers to the opposite side of the board.

SUMMARY OF THE INVENTION

A surface mounted LED and holder according to this invention includes a high temperature plastic holder surrounding an LED with improved wire bond strength resulting in thermal protection to survive the reflow soldering process.

A surface mounted LED according to a preferred embodiment of this invention includes an LED and a holder. The holder preferably includes a plurality of feet arranged at approximately equal intervals around the perimeter of a base of the holder. The feet are preferably positioned to correspond with a preferred solder pad layout for attaching the surface mount LED to a substrate using conventional reflow soldering techniques. In addition, the holder preferably includes a plurality of through holes permitting use in connection with a variety of two, three and four lead LEDs.

As manufacturing turns to surface mounted technology instead of traditional through hole technology, a demand is anticipated for reliable surface mounted LED assemblies. Relevant industries include automotive, telecommunications, industrial, signage and/or any other industry requiring incorporation of improved LED assemblies.

Costs savings may be realized by moving away from a through hole device to a surface mounted device. Additionally, wave soldering may be avoided through the use of the described configuration of the device. The device according to this invention will preferably withstand reflow soldering exposure to 255 degrees C. for 10 seconds.

BRIEF DESCRIPTION OF THE DRAWINGS

The above-mentioned and other features and objects of this invention will be better understood from the following detailed description taken in conjunction with the drawings wherein:

FIG. 9 is a front perspective view of the surface mount LED according to one embodiment of this invention;

FIG. 10 is a top view of the surface mount LED of FIG. 9;

FIG. 11 is a top view of the surface mount LED of FIG. 9;

FIG. 12 is a bottom view of the surface mount LED of FIG. 9;

FIG. 13 is a drawing of a solder pad layout according to one embodiment of this invention;

DESCRIPTION OF PREFERRED EMBODIMENTS

Figure 1A:
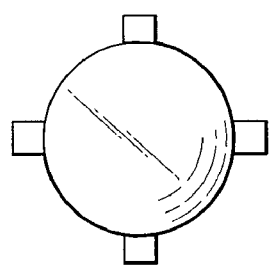
FIGS. 1a-c show a top view, a side view and a reflow profile of a prior art surface mount LED.
Figure 1B:
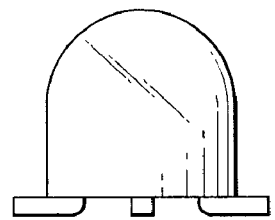
Figure 1C:
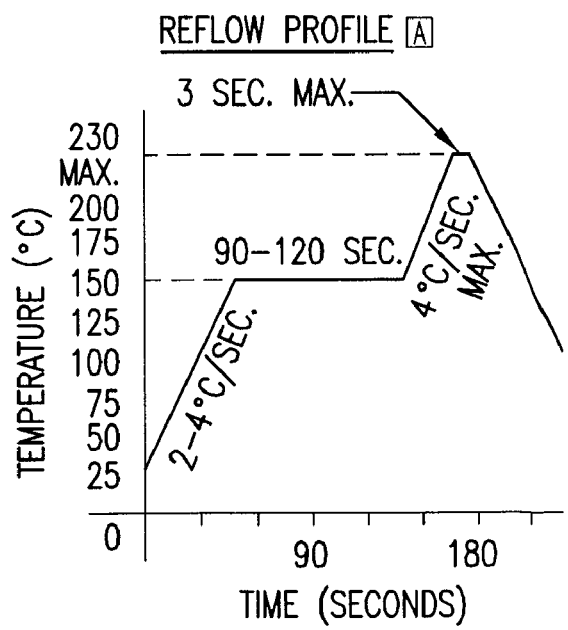
Figure 2D:
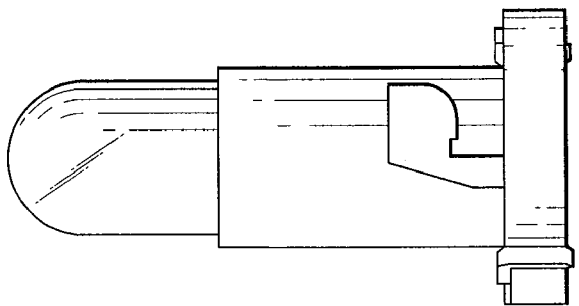
FIGS. 2a-d show a perspective view, a top view, a side view and a top view of a PCB cutout for a prior art through hole LED holder.
Figure 2B:
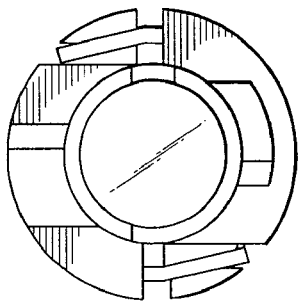
Figure 2C:
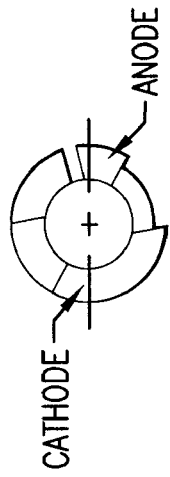
Figure 2A:
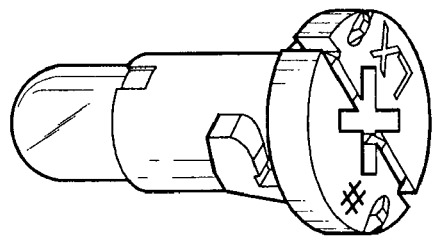
Figure 3:
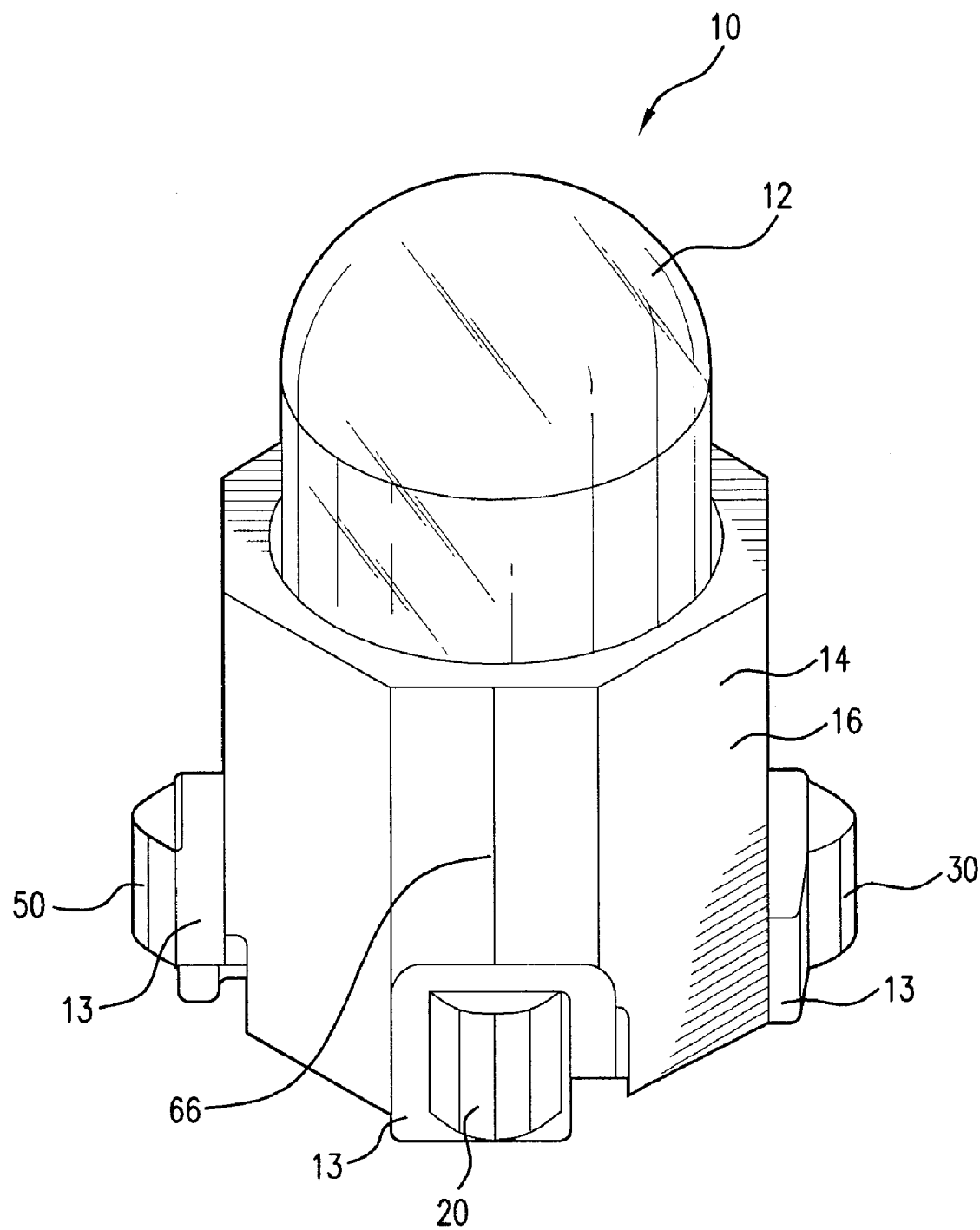
FIG. 3 is a front perspective view of a surface mount LED according to one embodiment of this invention.

FIG. 3 shows a perspective view of surface mount LED 10 according to one embodiment of this invention. Surface mount LED 10 includes LED 12 and holder 14.

LED 12 may be either a single-color or multi-color LED with any number of leads 13 but generally include two to four leads 13. Single-color LEDs generally include two leads 13 while multi-color LEDs generally include three or four leads 13. LED 12 should be able to withstand reflow soldering exposure to 255 degrees C. for 10 seconds. LED 12 may include a standard leadframe, alternatively LED 12 may include a leadframe with a smaller foot print. In one preferred embodiment, the leadframe has a 0.4×0.5 mm sq. foot print. To minimize failure of LED 12 during the reflow soldering process, pull strength of a bond wire of LED 12 may be improved. The pull strength can be improved with a thicker wire bond and/or by adding an extra ball bond on top of a wedge bond on the leadframe side.

Figure 4:
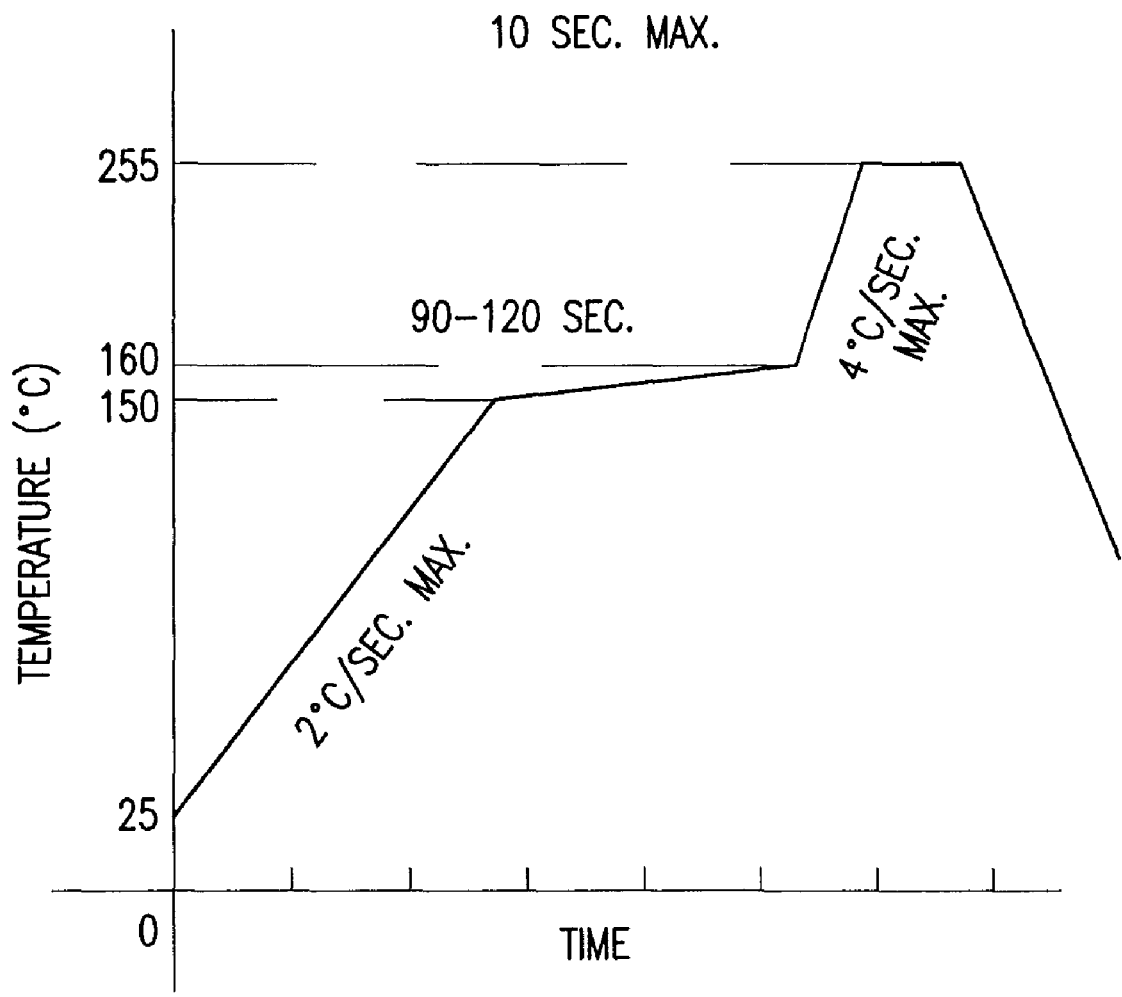
FIG. 4 is a graph of a lead free reflow soldering profile.

Holder 14 preferably comprises a high temperature plastic and is preferably molded of a polyphenylene sulfide (PPS) material or similar material capable of withstanding high temperatures and impact. The high temperature plastic should preferably withstand reflow soldering exposure to 255 degrees C. for 10 seconds. FIG. 4 shows a lead free reflow soldering profile.

Figure 5:
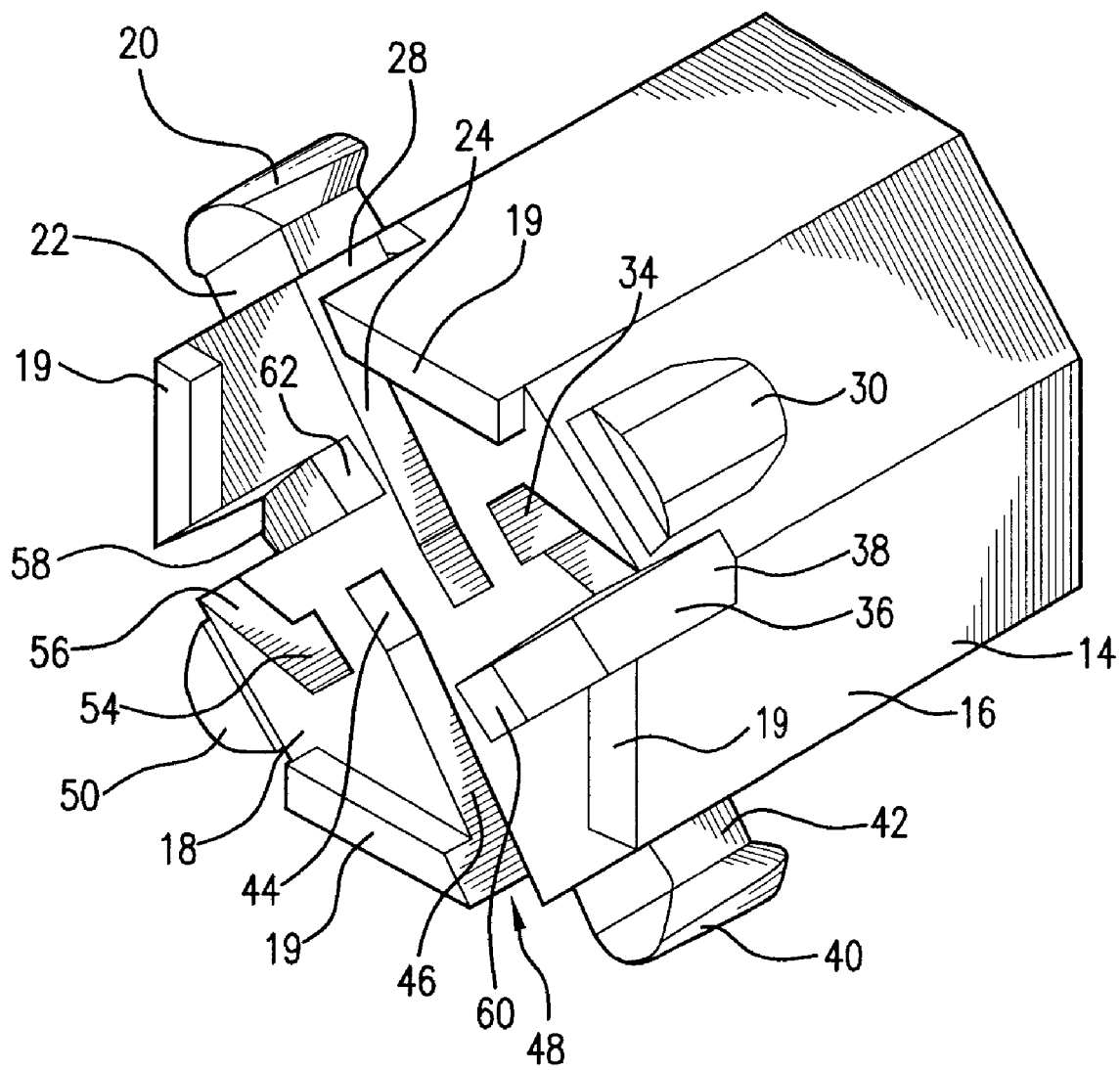
FIG. 5 is a bottom perspective view of a holder according to one embodiment of this invention.

FIGS. 5-8 show various perspectives of holder 14 without LED 12 according to one embodiment of this invention. According to this preferred embodiment of the invention, holder 14 includes base 16 and at least one foot and preferably a plurality of feet 20, 30, 40, 50, each foot including a corresponding wrap section 22, 32, 42, 52 which connects foot 20, 30, 40, 50 to holder 14. FIG. 5 shows a perspective view from the underside of holder 14. In FIG. 5, holder 14 includes first foot 20 and first wrap section 22, second foot 30 and second wrap section 32, third foot 40 and third wrap section 42, fourth foot 50 and fourth wrap section 52. Additionally, each foot 23, 30, 40, 50 is preferably arranged in equal intervals of 90 degrees around a perimeter of base 16. Each foot 20, 30, 40, 50 is preferably positioned to correspond with a preferred solder pad layout for attaching surface mount LED 10 to a substrate, such as a printed circuit board (PCB), using contemporary reflow soldering techniques.

According to a preferred embodiment of this invention, base 16 further includes lower surface 18 and at least one and preferably a plurality of supports 19. In FIG. 5, a bottom of each foot 20, 30, 40, 50 and a bottom of each support 19 are generally coplanar. This configuration allows contact points 21, 31, 41 and 51 (as shown in FIG. 12) to be located generally adjacent to a respective foot 20, 30, 40, 50 and away from a center of lower surface 18.

According to a preferred embodiment of this invention, holder 14 includes at least one through hole 24, 34, 44, 54 and preferably a plurality of through holes permitting use in connection with a variety of two, three and four lead LEDs. Additionally, holder 14 preferably includes at least one channel 26, 36, 46, 56 and preferably a plurality of channels formed in lower surface 18. Each channel connects with either one or two through holes. Preferably, each channel is distinct and does not intersect with any other channel. Each channel preferably forms an opening in a side of holder 14 and adjacent to a corresponding wrap section.

Figure 6:
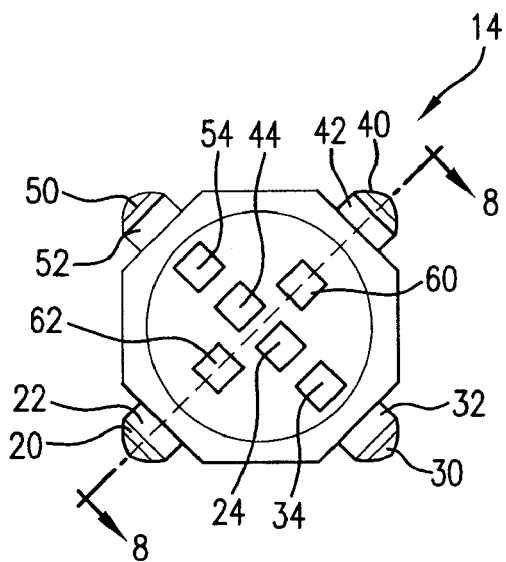
FIG. 6 is a top view of the holder of FIG. 5.
Figure 7:
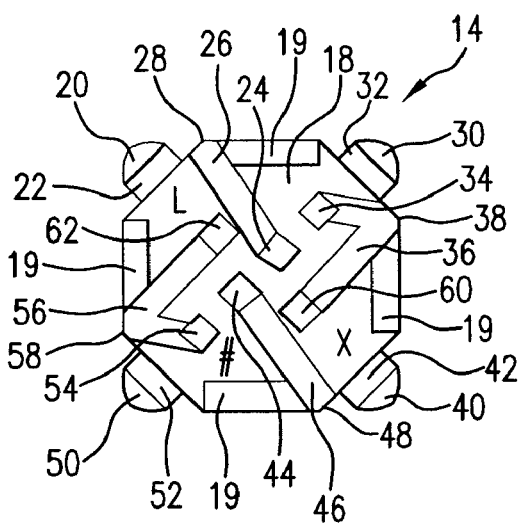
FIG. 7 is a bottom view of the holder of FIG. 5.
Figure 14:
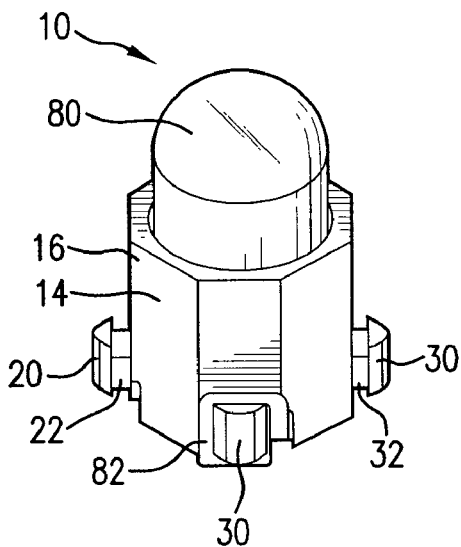
FIG. 14 is a front perspective view of the surface mount LED according to one embodiment of this invention.
Figure 16:
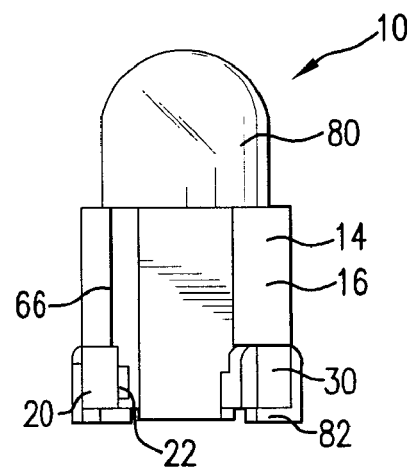
FIG. 16 is a top view of the surface mount LED of FIG. 14.
Figure 15:
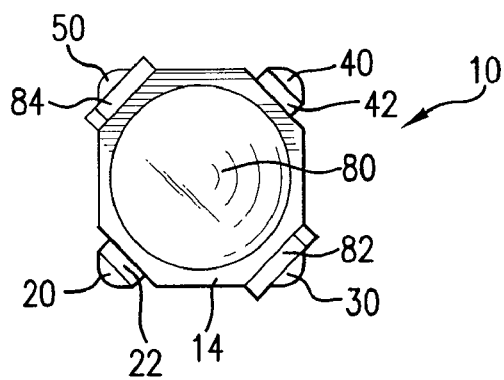
FIG. 15 is a top view of the surface mount LED of FIG. 14.

In the embodiment shown in FIGS. 6 and 7, a top view and bottom view of holder 16 respectively, holder 16 includes six through holes, first through hole 24, second through hole 34, third through hole 44, fourth through hole 54, fifth through hole 60 and sixth through hole 62. In FIG. 7, first through hole 24 connects with first channel 26 and first channel 26 forms opening 28 in holder 14 adjacent to first foot 20. Second through hole 34 and fifth through hole 60 connect with second channel 36 and second channel 36 forms opening 38 in holder 14 adjacent to second foot 30. Third through hole 44 connects with third channel 46 and third channel 46 forms opening 48 in holder 14 adjacent to third foot 40. Fourth through hole 54 and sixth through hole 62 connect with fourth channel 56 and fourth channel 56 forms opening 58 in holder 14 adjacent to fourth foot 50. In summary, each through hole preferably connects with a respective channel and the respective channel forms an opening in holder 14 adjacent to a respective foot.

Figure 8:
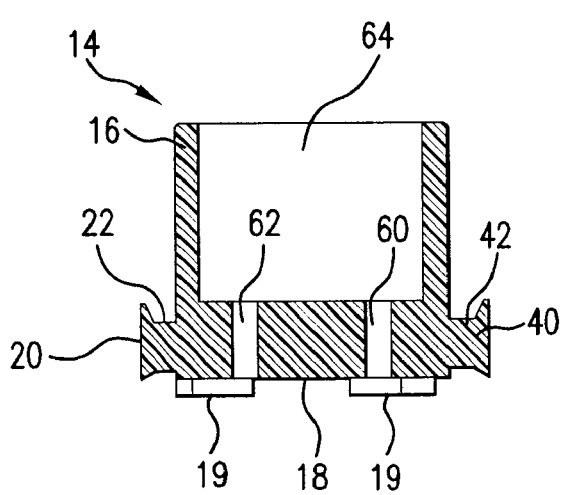
FIG. 8 is a cross-sectional side view of the holder along section 8-8 in FIG. 6.

FIG. 8 shows a cross-section view of holder 14 along section 6-6 in FIG. 6. In this cutout view, holder 14 partially defines cavity 64. Cavity 64 is formed to partially surround and support LED 12, insulating LED 12 during the reflow soldering process.

In operation, an LED is inserted into holder 14 in advance of the reflow soldering operation. FIGS. 9-12 show different perspectives of one embodiment of this invention. In this embodiment, surface mount LED 10 includes LED 12 inserted into holder 14. LED 12 may comprise a multicolor 5 mm dome LED 70 which preferably includes four leads: common cathode 72; red anode 74; blue anode 76; and green anode 78. The multicolor 5 mm dome LED 70 can produce virtually any color from these three anodes.

Referring to FIG. 12, common cathode 72 passes through first through hole 24 into first channel 26 out of first opening 28 around first wrap section 22 of first foot 20, thereby forming first contact point 21. Red anode 74 passes through second through hole 34 into second channel 36 out of second opening 38 around second wrap section 32 of second foot 30, thereby forming second contact point 31. Blue anode 76 passes through third through hole 44 into third channel 46 out of third opening 48 around third wrap section 42 of third foot 40, thereby forming third contact point 41. Green anode 78 passes through fourth through hole 54 into fourth channel 56 out of fourth opening 58 around fourth wrap section 52 of fourth foot 50, thereby forming first contact point 51. In this embodiment fifth through hole 60 and sixth through hole 62 are not utilized.

As a result of the described wrap, four contact points 21, 31, 41 and 51 are formed near each foot 20, 30, 40 and 50. These four contact points 21, 31, 41 and 51 correspond with a solder pad layout, shown in FIG. 13, for attaching surface mount LED 10 to a substrate using a reflow technique. The resulting geometry creates a stable and solderable device that minimizes defects resulting from reflow soldering.

As shown in FIG. 3, first foot 20 is preferably marked with polarity marking 66, polarity marking 66 can be a line or similar molded-in surface feature. Polarity marking 66 provides a reference for the assembly of LED 12 to holder 14, making the process repeatable and predictable.

Figure 17:
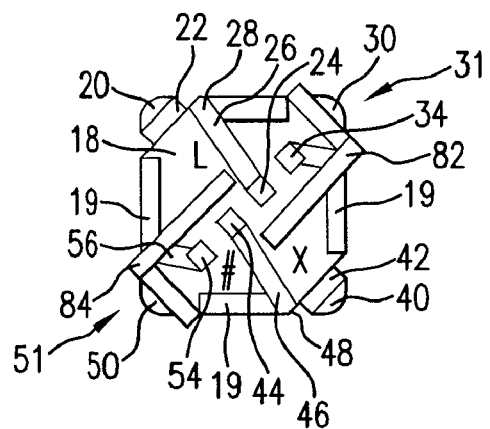
FIG. 17 is a bottom view of the surface mount LED of FIG. 14.

FIGS. 14-17 show one embodiment of this invention. In this embodiment, surface mount LED 10 includes LED 12 inserted into holder 14. LED 12 is a single-color 5 mm dome LED 80 which includes cathode 82 and anode 84. Referring to FIG. 17, cathode 82 passes through fifth through hole 60 into second channel 36 out of second opening 38 around second distal wrap 32 of second foot 30, thereby forming contact point 31. Anode 84 passes through sixth through hole 62 into fourth channel 56 out of fourth opening 58 around fourth wrap section 52 of fourth foot 50, thereby forming contact point 51. In this embodiment, first through hole 24, second through hole 34, third through hole 44, fourth through hole 54, first foot 20 and third foot 40 are not utilized. As a result of the described wrap, two contact points 31, 51 are formed. These two contact points 31, 51 correspond with a solder pad layout for attaching surface mount LED 10 to a substrate using a reflow technique.

While in the foregoing specification this invention has been described in relation to certain preferred embodiments thereof, and many details have been set forth for purpose of illustration, it will be apparent to those skilled in the art that the LED holder is susceptible to additional embodiments and that certain of the details described herein can be varied considerably without departing from the basic principles of the invention.

What is claimed is:

1. A surface mount light emitting diode (LED) comprising:
    a holder having a through hole and a base, the base having a lower surface;
    a foot including a wrap section, the foot connected to the base of the holder;
    a channel formed in the lower surface and connected with the through hole; and
    an LED at least partially surrounded by the holder and including a lead, wherein the lead passes through the through hole and the channel and wraps around the foot at the wrap section forming a contact point, wherein the contact point corresponds with a solder pad layout for attaching the lower surface to a substrate using a reflow soldering technique.

2. The surface mount LED of claim 1, wherein the holder further comprises a high temperature plastic.

3. The surface mount LED of claim 1 further comprising a plurality of feet arranged at equally spaced intervals around a perimeter of the base of the holder.

4. The surface mount LED of claim 1 further comprising:
four feet arranged at 90 degree intervals around a perimeter of the base of the holder; and
four through holes, each through hole of the four through holes associated with a respective foot of the four feet, wherein the LED comprises four leads, each lead of the four leads passing through a respective through hole and wrapping around the respective foot at the wrap section.

5. The surface mount LED of claim 4, wherein the LED comprises a multi-color LED.

6. The surface mount LED of claim 4, wherein the four leads comprise a common cathode, a green anode, a red anode and a blue anode.

7. The surface mount LED of claim 1, wherein the holder is molded of a polyphenylene sulfide (PPS) material.

8. The surface mount LED of claim 1, wherein the foot is marked with a polarity marking.

9. The surface mount LED of claim 1, wherein the LED comprises a 5 mm dome LED.

10. The surface mount LED of claim 1, wherein the surface mount LED withstands reflow soldering exposure to 255 degrees C. for 10 seconds.

11. A surface mount light emitting diode (LED) comprising:
a holder having four through holes and a base, the base having a lower surface;
four feet, each foot including a wrap section, the four feet arranged at 90 degree intervals around a perimeter of the base of the holder
each through hole of the four through holes associated with a respective foot of the four feet; and
an LED at least partially surrounded by the holder and including four leads, wherein each lead of the four leads passes through a respective through hole and wraps around the respective foot at the wrap section forming a contact point, wherein each contact point corresponds with a solder pad layout for attaching the lower surface to a substrate using a reflow soldering technique.

12. The surface mount LED of claim 11 further comprising a channel formed in the lower surface.

13. The surface mount LED of claim 11, wherein the LED comprises a multi-color LED.

14. The surface mount LED of claim 11, wherein the holder is molded of a polyphenylene sulfide (PPS) material.

15. A light emitting diode (LED) holder comprising:
a high temperature plastic body having a through hole and a base, the base having a lower surface;
a foot including a wrap section, the foot connected to the base of the holder; and
a channel formed in the lower surface and connected with the through hole; and
wherein the channel and the foot form a contact point that corresponds with a solder pad layout for attaching the lower surface to a substrate using a reflow soldering technique.

16. The LED holder of claim 15, further comprising a plurality of feet arranged at equally spaced intervals around a perimeter of the base of the holder.

17. The LED holder of claim 15, further comprising:
four feet arranged at 90 degree intervals around a perimeter of the base of the holder;
four through holes, each through hole of the four through holes associated with a respective foot of the four feet;
four channels, each channel of the four channels connected with a respective through hole.

18. The LED holder of claim 15, wherein the foot is marked with a polarity marking.

19. The LED holder of claim 15, wherein the high temperature plastic body comprises a polyphenylene sulfide (PPS) material.

20. The LED holder of claim 15, wherein the high temperature plastic body withstands reflow soldering exposure of 255 degrees C. for 10 seconds.

* * * * *